US005745581A

United States Patent [19]
Eatwell et al.

[11] Patent Number: 5,745,581
[45] Date of Patent: Apr. 28, 1998

[54] TRACKING FILTER FOR PERIODIC SIGNALS

[75] Inventors: Graham P. Eatwell, Cambridge, United Kingdom; Yong J. Yan, Piscataway, N.J.

[73] Assignee: Noise Cancellation Technologies, Inc., Linthicum, Md.

[21] Appl. No.: 694,806

[22] Filed: Jul. 26, 1996

Related U.S. Application Data

[63] Continuation of Ser. No. 187,022, Jan. 27, 1994, abandoned.
[51] Int. Cl.$^6$ ............................................. A61F 11/06
[52] U.S. Cl. ....................... 381/71.11; 381/72; 381/71.12
[58] Field of Search ........................... 381/71–72, 86, 381/94, 71.1–71.9, 71.11–71.14; 364/724.06, 724.08, 724.09, 724.16, 724.17

[56] References Cited

U.S. PATENT DOCUMENTS

| 5,319,715 | 6/1994 | Nagami et al. | 381/71 |
| 5,321,759 | 6/1994 | Yuan | 381/71 |
| 5,426,704 | 6/1995 | Tamamura et al. | 381/71 |

Primary Examiner—Edward L. Coles, Sr.
Assistant Examiner—Stephen Brinich

[57] ABSTRACT

A method for designing a frequency periodic filter with a frequency response which has a periodic bandwidth including designing a first sampled data filter whose response corresponds to a set period and replacing each unit sampling delay by a second sampled data filter.

22 Claims, 8 Drawing Sheets

TRACKING FILTER FOR PERIODIC SIGNALS

This application is a continuation of application No. 08/187,022 filed Jan. 27, 1994, now abandoned.

FIELD OF THE INVENTION

This invention relates to a sampled data filter for periodic signals. The filter has application for removing periodic noise or interference, such as siren noise, from communications signals.

BACKGROUND

Emergency vehicles, such as fire-engines, ambulances and police cars, use high power sirens to warn other vehicles of their approach. These sirens must be extremely loud to be effective. This creates the problem of the driver and/or crew of the emergency vehicle not hearing the communications from his radio nor hearing horns or warning noises from other vehicles. It is impractical and expensive to isolate the cabins of such vehicles from the siren noise. It is also undesirable to do so since the occupants must be able to hear the warnings of other vehicles.

The occupants of emergency vehicles need to be able to communicate with other vehicles and with centralized command centers. Unfortunately, the siren noise is picked up by the communications microphone and interferes with the communication. The siren noise reduces the intelligibility of the communication and can cause mis-communication - which is a potentially dangerous situation.

One way of removing the interference is to pass the communication signal through a filter which has low gain at the frequencies of the siren. The siren noise is substantially periodic, so the siren noise is at integer multiples of a fundamental frequency. The desired filter should have low gain at these frequencies. However, it has proved to be difficult to produce such filters in practice because the fundamental frequency of the siren noise can change very rapidly.

One approach is disclosed in U.S. Pat. No. 4,736,432 to Cantrell. This approach uses cascaded notch filters controlled by a ramp signal. However, when the siren frequency is changing rapidly, the interfering noise is modulated in both amplitude and phase by the acoustics of the siren drive and the cabin and is also frequency modulated. This means that the noise has finite bandwidth. A simple notch filter, whilst providing some reduction, will still leave significant interference. The requirement for a ramp signal makes the filter unsuitable for use with existing sirens. No methods are disclosed for designing digital comb filters, but there is a requirement for a look up table containing filter coefficients for each siren frequency. This means that the digital processor must make a compromise between expensive high speed memory and coefficient accuracy. This will add cost or further reduce performance.

The design of fixed sampled data filters, especially digital filters, is well established. In particular there are methods for designing fixed filters with a high-pass characteristic (that is, the gain of the filter is lower for frequency components in some low frequency range than it is at frequencies in some higher frequency range) or low-pass characteristics (that is, the gain of the filter is lower for frequency components in some high frequency range than it is at frequencies in some lower frequency range). Methods also exist for designing filters with band-pass characteristics (that is, the gain of the filter is lower for frequency components in some low and high frequency ranges than it is at frequencies in some intermediate frequency range).

Methods also exist for designing sampled data filters with poles and zeros at prescribed locations in the complex frequency domain. (Equivalent methods use the Laplace or 'z' transform domains).

Methods also exist for designing 'comb' filters which have poles or zeros periodically spaced in the frequency domain.

These comb filters have some of the desired characteristics and have been used for the removal of periodic noise or interference from signals.

One technique for designing comb filters with fixed frequency notches is described in 'Digital Filters and Signal Processing' by L. B. Jackson, 2nd edition, Kluwer Academic Publishers, 1989, pages 94–96. This technique can only produce notches at frequencies integrally related to the sampling frequency. It cannot be used for filtering out siren noise since the siren frequencies vary continuously.

An analog comb filter for removing fixed frequency 'hums' is disclosed in U.S. Pat. No. 4,733,193 to Klokocka.

A tracking digital comb filter is disclosed by Eatwell and is incorporated herein by reference. A simple analysis shows that this filter consists of interlaced poles and zeros. The filter is shown in FIG. 1. The frequency response (transfer function) of the filter is $$F(\omega) = \frac{(-a)(1 - e^{-i\omega T})}{1 - ae^{-i\omega T}} \quad (1)$$

where $\omega$ is the radian frequency, T is the fundamental period of the interference and a is the feedback coefficient which determines the position of the complex poles.

The filter described in equation (1) has a periodic frequency response, so that it can remove all the harmonics of a time periodic signal.

For applications where the period or frequency of the disturbance is changing, a simple zero at the disturbance frequency is not always sufficient and it is necessary to design a filter with some width or shape to the notch.

SUMMARY OF THE INVENTION

One aspect of the current invention is a method for designing a frequency periodic filter, that is a filter with a frequency response which is periodic in some bandwidth. The first step in this method comprises designing a first sampled data filter whose response corresponds to one period of the desired sampled data. The unit sampling delays in the first sampled data filter are then replaced by variable filters each with an effective delay which is related to the desired period of the filter.

A further aspect of the current invention is a method for utilizing a frequency periodic filter to remove substantially periodic noise or interference from a signal. The first step in this method comprises designing a first sampled data filter with a frequency response close to zero at some frequency. The unit sampling delays in this first sampled data filter are then replaced by variable filters each with an effective delay related to the fundamental period of the interference so as to produce a frequency periodic filter whose response is close to zero at the frequencies of the interference. The signal containing the interference is then passed through the frequency periodic filter so that the interference is removed.

A further aspect of the current invention is to provide a means for removing siren noise from a communication signal. A frequency periodic filter is designed to have low gain at frequencies close to the frequencies of the siren noise. The period of the frequency periodic filter is then varied according to the period of the siren noise by use of a signal synchronized with the siren drive signal.

OBJECTS

One object of this invention is to provide a method for designing sampled data filters whose frequency response is periodic within some bandwidth.

Another object of this invention is to provide a method and system for removing substantially periodic noise or interference from communications signals.

Another object of this invention is to provide a method and system for removing siren noise from communications signals.

These and other objects will become apparent when reference is made to the accompanying drawing in which:

DETAILED DESCRIPTION OF INVENTION

A Frequency Periodic Filter with period $f_p$ Hertz ( $f_p$ cycles per second) is a filter whose frequency response repeats every $f_p$ Hertz. Thus, the frequency response of the filter, F(f), satisfies $$F(f)=F(f+f_p) \quad (2)$$

for all f within some range.

A common way to implement a filter is a sampled data filter. In this type of filter the input signal is sampled at fixed intervals separated by a time t so that the sampling frequency is $f_s=1/t$. The output samples are given by a sum of the current and past input samples and the past output samples. Hence, if u(nt) denotes the input sample at time nt (where n is an integer), then the output samples are given by $$y(nt) = -\sum_{k=1}^{KA} a(k) \cdot y(nt-kt) + \sum_{k=0}^{KB} b(k) \cdot u(nt-kt) \quad (3)$$

where a(k) denote the KA reverse coefficients and b(k) denote the (KB+1) forward coefficients.

The input signal may need to be filtered before sampling to remove frequencies higher than the Nyquist frequency (half the sampling frequency). This avoids the effects of aliasing. The characteristic of this anti-aliasing filter is denoted by S(f). For applications where the communication signal is a speech signal the anti-aliasing filter may be a bandpass filter to remove frequency components outside of the speech bandwidth.

The continuous output signal may be obtained by using a sample and hold device which provides a stepped output signal, this signal can then be passed through a low pass filter to provide a smooth output and avoid the effects of imaging. The characteristic of this anti-imaging filter is denoted by R(f).

Figure 1:
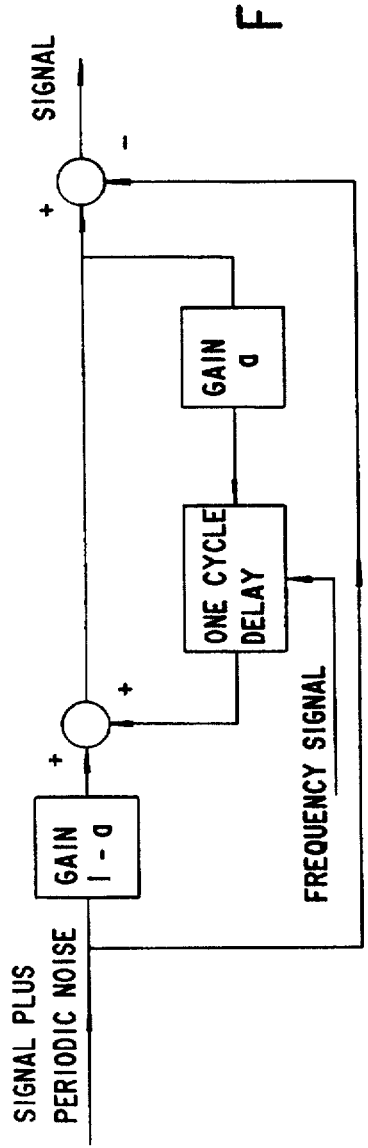
Figure 2:
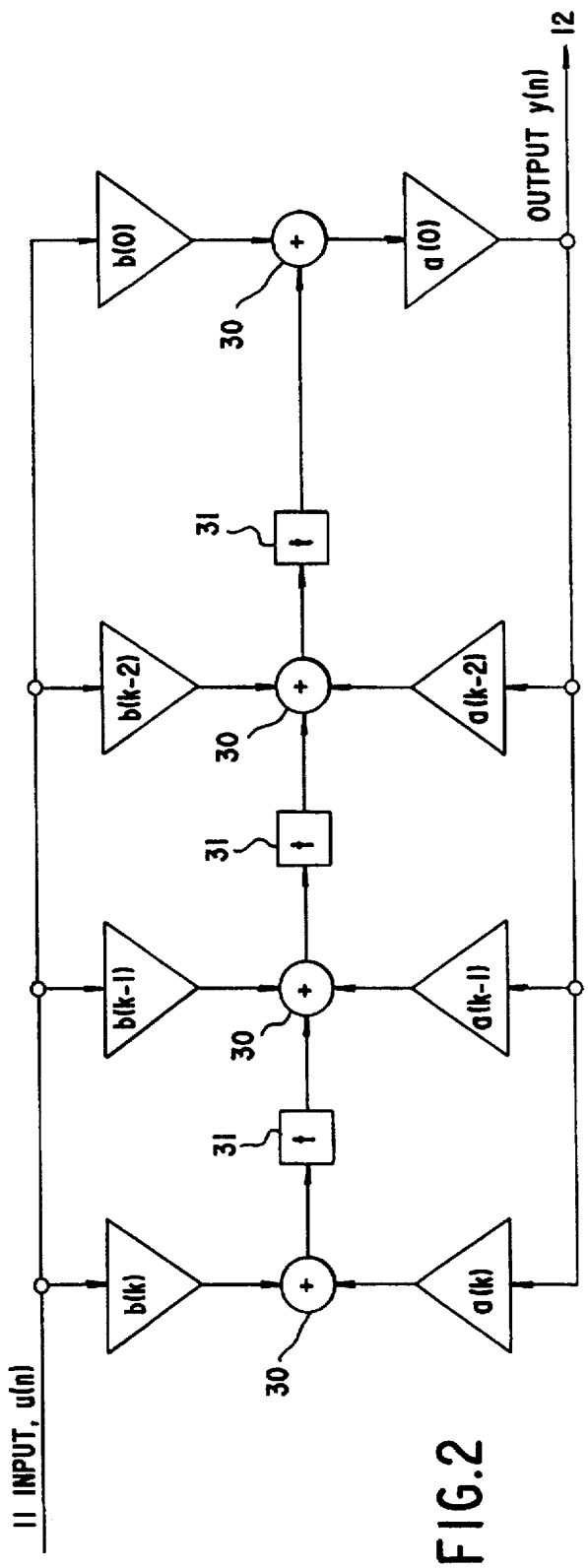

There are many known structures for implementing this type of filter-direct, canonical, cascade, parallel biquad, etc. Some of these structures are described in 'Digital Filters and Signal Processing' by L. B. Jackson, 2nd edition, Kluwer Academic Publishers, 1989, pages 71-83. The preferred form depends upon the particular hardware architecture. One implementation is shown in FIG. 2. The output signal 12 is a weighted sum of the past outputs and the current and past inputs. The filter coefficients, a(k) and b(k), are multiplication or gain elements. A series of summing elements 30 and unit sample delay elements 31. In this implementation the coefficients are scaled by a factor 1/b(O) which facilitates implementation using fixed point digital arithmetic.

The general filter structure consists of gain elements (multipliers), unit delays (buffers) and summing elements.

The transfer function of this filter, that is, its frequency response, is given by $$F_s(f) = \frac{\sum_{k=0}^{KB} b(k) e^{-i2\pi k f/f_s}}{\sum_{k=0}^{KA} a(k) e^{-i2\pi k f/f_s}} \quad (4)$$

where a(O)=1 and i is the square root of (−1).

The overall response of the filter, including the anti-aliasing and anti-imaging filters is $$H(f)=R(f)F(f)S(f) \quad (5)$$

The frequency periodic filters of the current invention are obtained by using the same structure as the known sampled data filters except that each of the unit sampling delays in the filter is replaced by a filter with an effective delay T. The input sampling rate is unchanged. Assuming that the filters accurately provide a delay, the output of the new filter is given by $$y(nt) = -\sum_{k=1}^{KA} a(k) \cdot y(nt-kT) + \sum_{k=0}^{KB} b(k) \cdot u(nt-kT) \quad (6)$$

The transfer function of this filter, that is, its frequency response, is given by $$F(f) = \frac{\sum_{k=0}^{KB} b(k) e^{-i2\pi k f/f_p}}{\sum_{k=0}^{KA} a(k) e^{-i2\pi k f/f_p}} \quad (7)$$

where $f_p=1/T$. It is clear that this new filter is a frequency periodic filter since it has the property that $$F_T(f)=F_T(f+f_p) \quad (8)$$

The response of the new filter is related to the response of the original (unit sample delay) filter by $$F_s(af_s)=F_T(af_p)+F_T((a+1)f_p)=F_T((a+2)f_p) \text{ etc.} \quad (9)$$

Figure 3:
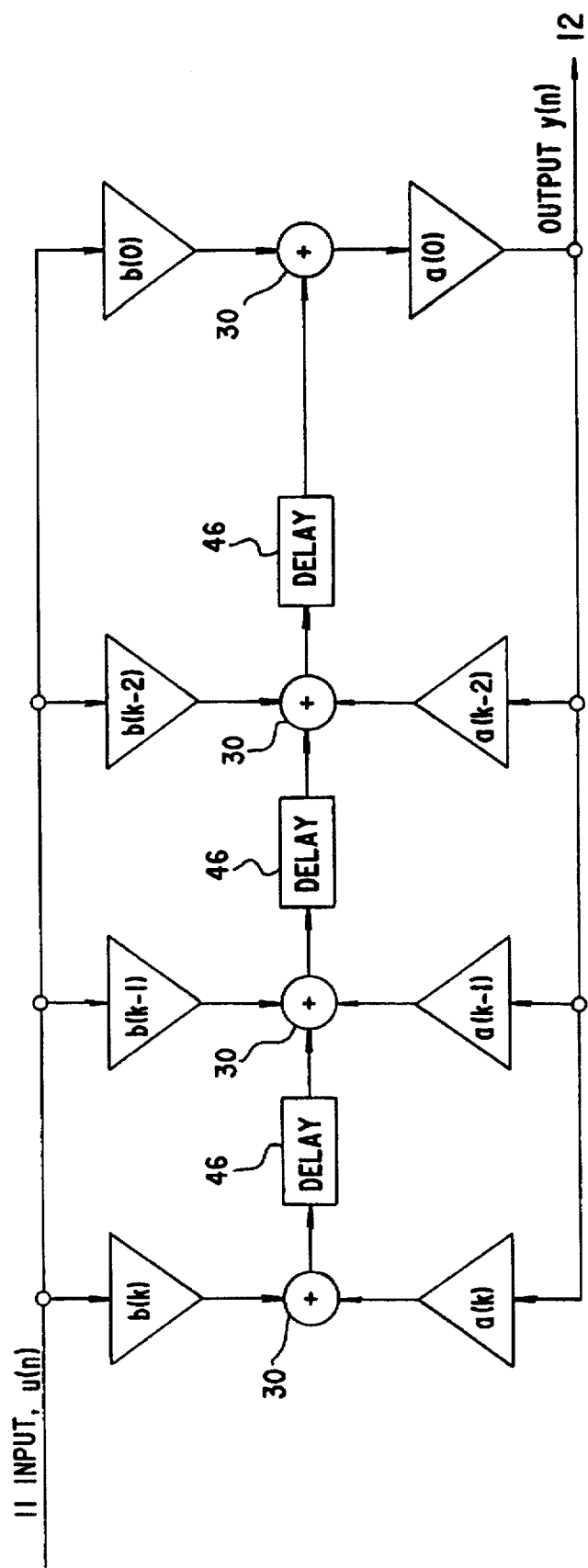

An example of the new filter is shown in FIG. 3. The unit sample delays have been replaced by effective delay elements 46. Two methods for implementing effective delays will be described later.

Figure 4:
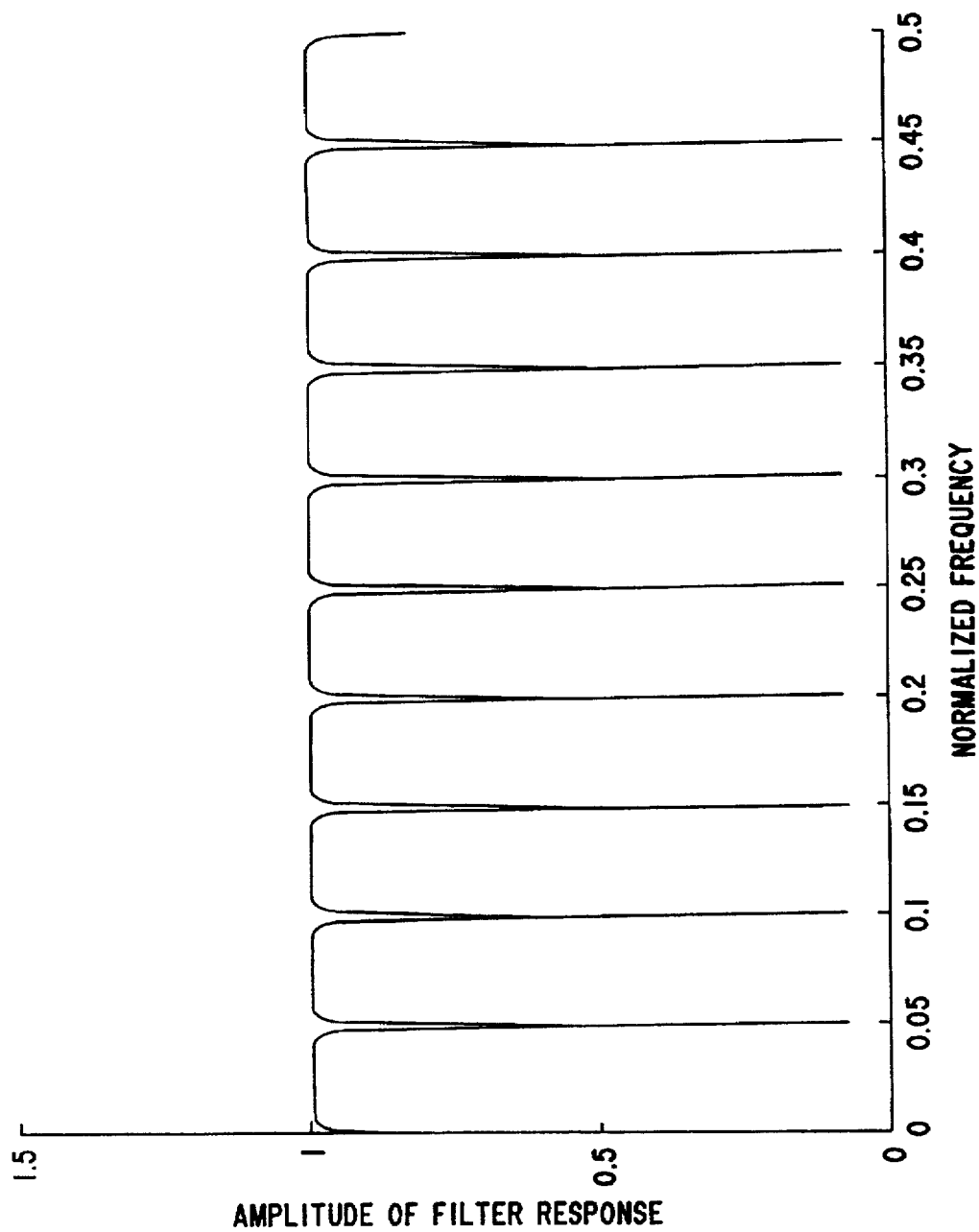

One way of obtaining a comb filter is to design the original filter to be a high pass filter, so that it has low response at f=0. The new filter is then obtained by setting T equal to the fundamental period of the noise. The new filter response will then have low response at all of the harmonics of the noise and so the interference will be reduced. An example of the response of this type of filter is shown in FIG. 4. This figure shows the linear amplitude response frequency response as a function of frequency for a filter in which the unit sample delays have been replaced by delays of 20 samples. The frequency is plotted as a fraction of the sampling frequency. Thus this filter has zero response at a frequency 1/20 of the sampling frequency. It also has zeros at integer multiples of this frequency.

Figure 5:
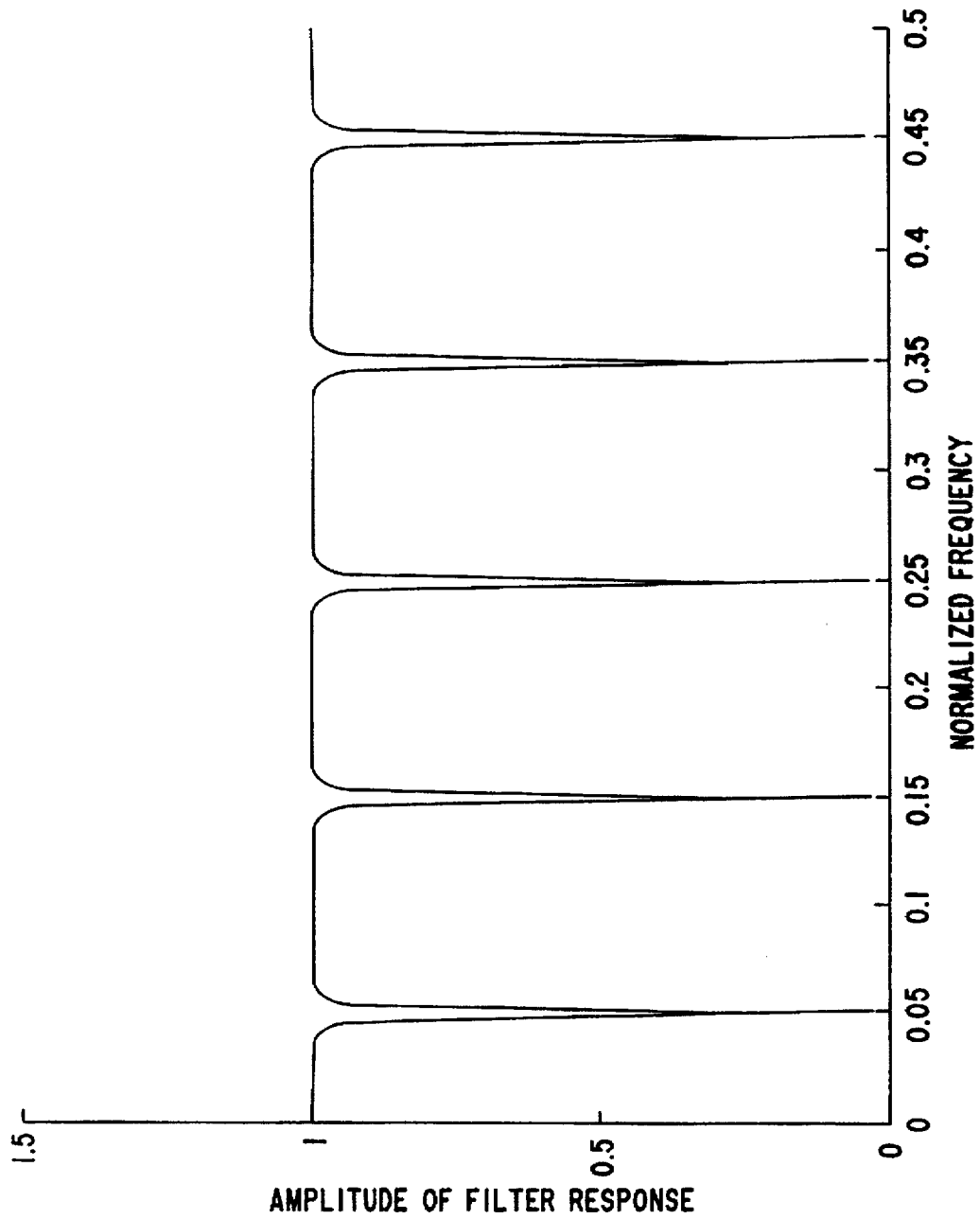

A siren drive signal often has a symmetric waveform so that it contains only odd multiples of the fundamental frequency. The original filter can then be designed to have low response at the Nyquist frequency, $f_s/2$. The new filter is designed with T equal to half of the fundamental period, so that the new filter has low response at only the odd multiples of the fundamental frequency. This will allow more of the desired signal to pass through the filter and provide for better intelligibility. An example of the linear amplitude response of this type of filter is shown in FIG. 5. Here the unit sampling delays have been replaced by delays of 10 samples.

Figure 6:
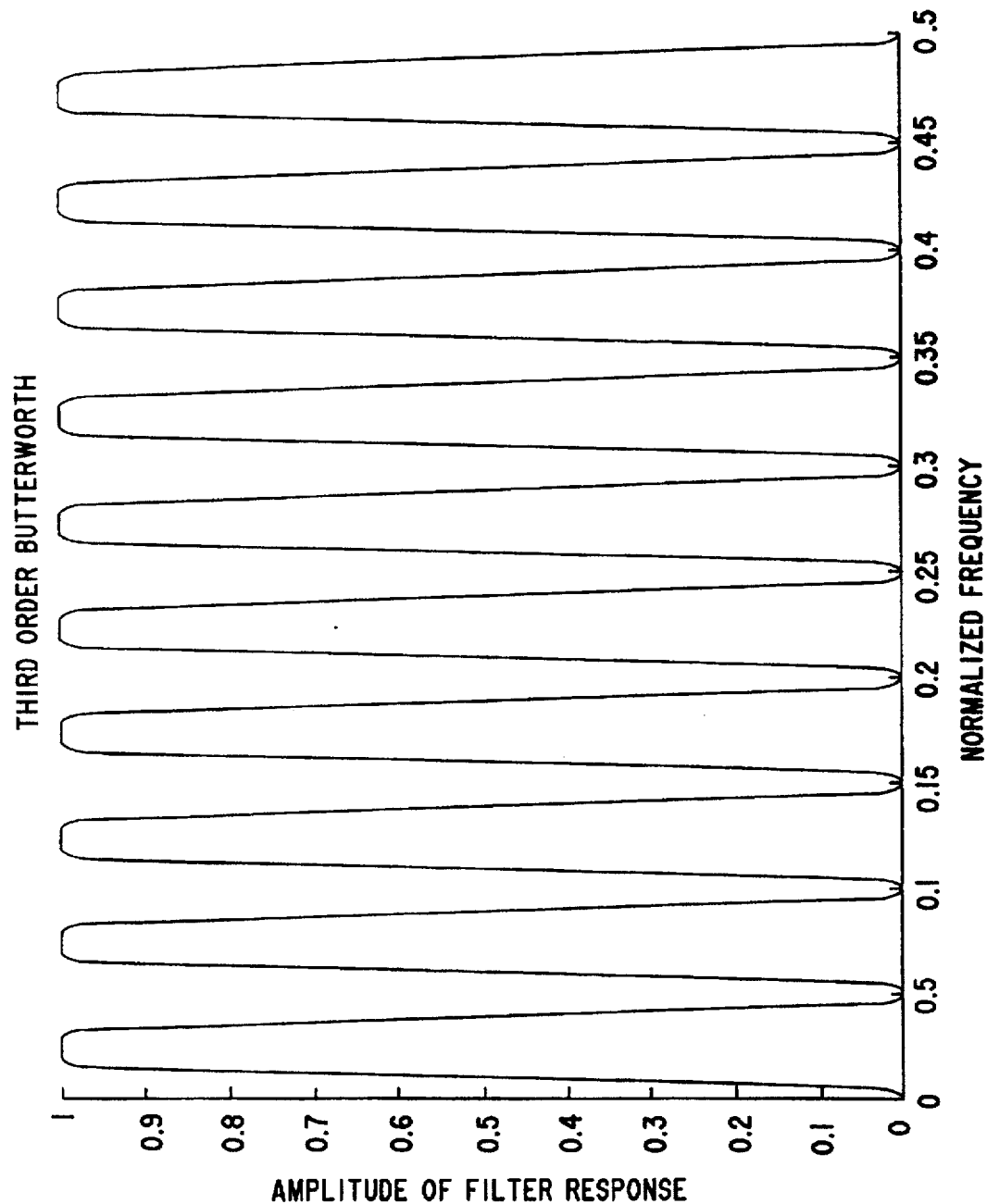

The filters in FIG. 4 and FIG. 5 comprised 3 cascaded first order sections. More general filter designs can be used. An example is shown in FIG. 6. In this example, a third order Butterworth filter was designed to give a high-pass response and then used to give a frequency periodic filter. This shows the linear amplitude response as a function of frequency. Notice that this filter gives broader notches than the filters in FIGS. 4 and 5 and so is more suitable for removing tone with varying frequencies.

In all of these examples the effective filter delay, T, is related to the fundamental period of the noise. The fundamental period can be obtained from the siren drive signal via a digital or analog tachometer, or it can be obtained from the input communication signal, or can be provided directly from the siren drive system itself. The siren drive system and the noise reduction filter can be combined so that a frequency or period signal is generated and then passed to both the siren drive signal generator and the noise reduction filter.

In a sampled data system only delays of an exact number of samples can be produced exactly. Other delays can be approximated using filters whose frequency response approximates $e^{-\omega}$ within the frequency range of interest.

The fundamental period can be written as $$T=(N+g)t, \text{ where } 0 \leq g < 1 \quad (10)$$

Figure 7:
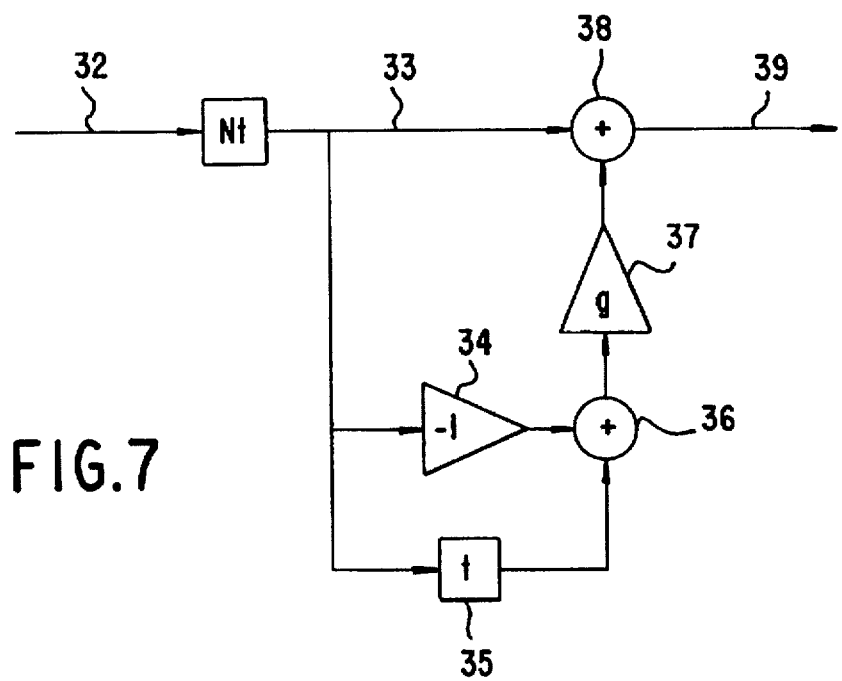

One example of a filter with an effective delay of T is a finite impulse response (FIR) filter. The 'z' transform of this filter is $$(1-g)z^{-N}+gz^{-(N+1)} \quad (11)$$

where $z^{-1}$ represents a unit sample delay. The preferred implementation of this filter, which uses a single multiplication or gain element, is shown in FIG. 7. The signal to be delayed 32 is first delayed by an integer number of sampling periods using delay element, Nt, to produce delayed signal 33. The delay element may be a simple delay line for example. The output from the delay element is delayed by a further sampling period in delay element 35 and is also inverted in 34. The sum of the inverted and further delayed signals are combined in summer 26 and passed through gain or multiplication element 34 before being combined with the delayed signal 33 in summing element 38 to produce output 39.

Another example of a filter with an effective delay of T is an infinite impulse response (IIR) filter. The 'z' transform of this filter is $$z^{-N} \cdot \frac{h+z^{-1}}{1+hz^{-1}}, \text{ where } h = \frac{1-g}{1+g} \quad (12)$$

Figure 8:
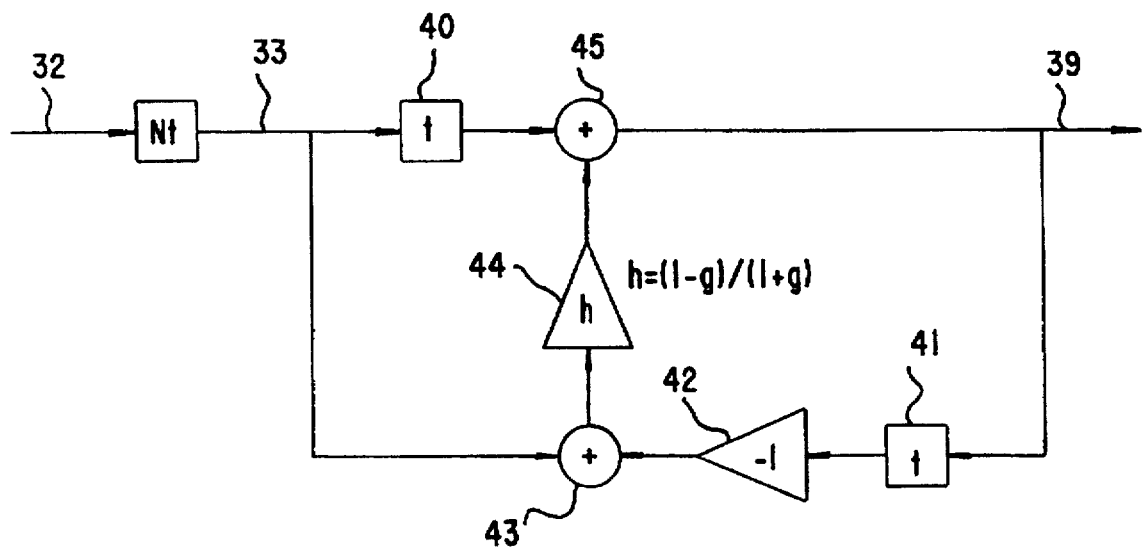

The preferred implementation of this filter, which uses a single multiply, is shown in FIG. 8. This filter uses delay elements Nt, 40 and 41, summing elements 43 and 45, inverter 42 and single gain or multiplication element 44.

Other filter designs will be apparent to those of ordinary skill in the art of digital filter design.

Figure 9:
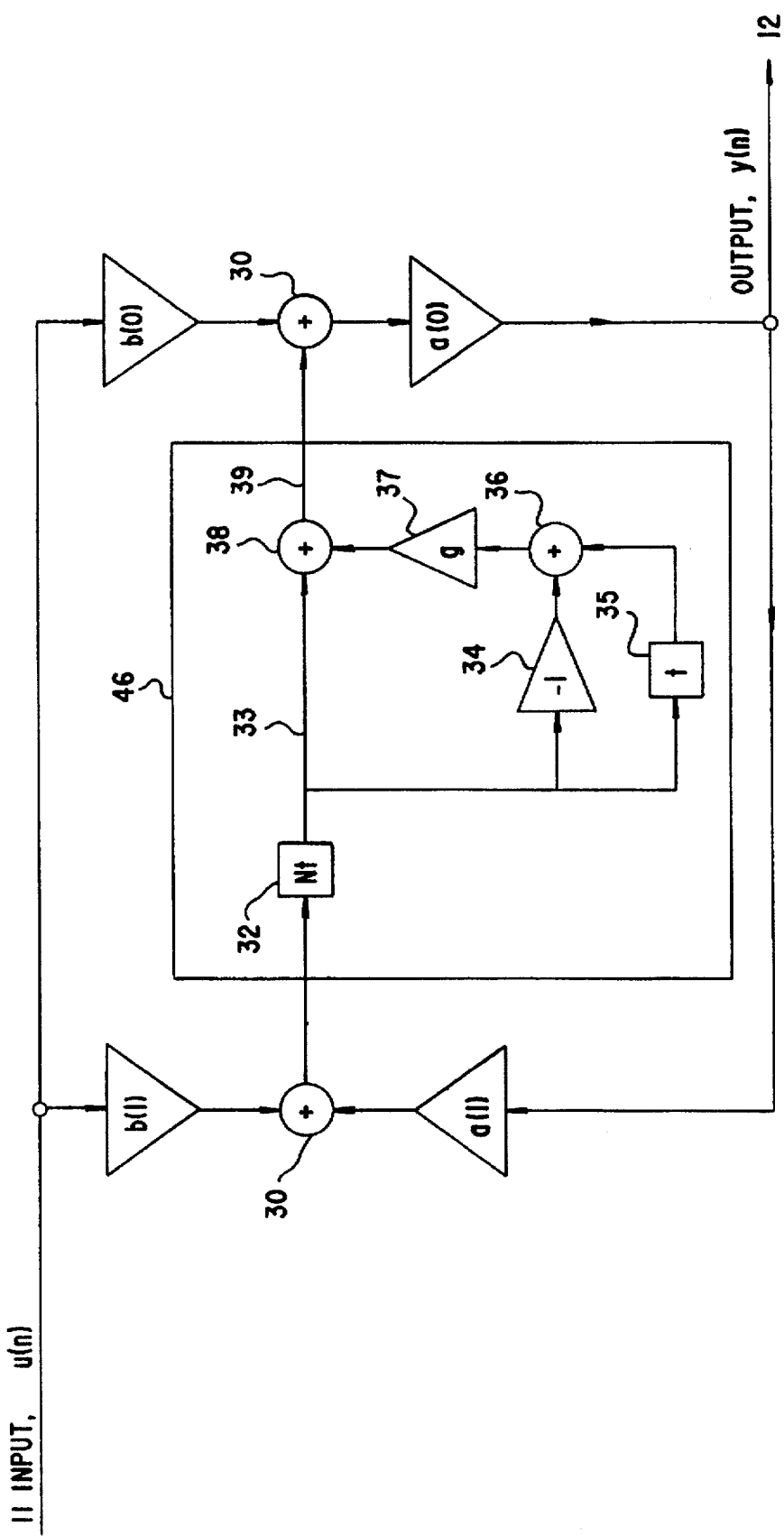

A more detailed diagram of a particular frequency periodic filter is shown in FIG. 9. This example is a first order recursive filter using an FIR filter of the type described by equation (11) for the effective delay 46. The gain 37 is varied according to the fundamental period of the noise. The a and b coefficients are fixed.

An alternative approach is to synchronize the sampling rate to the frequency of the disturbance. In this approach, the sampling rate is an integer multiple, M, say, of the disturbance frequency so that $f_s=M.f_p$. The delay line is then of fixed length M. This avoids the need to calculate the coefficients or gains h or g.

For applications where the fundamental frequency of the noise varies over a large range it may be necessary to use different integer multiples, M, in different frequency ranges so as to maintain the sampling rate in a prescribed range.

PREFERRED EMBODIMENT

Figure 10:
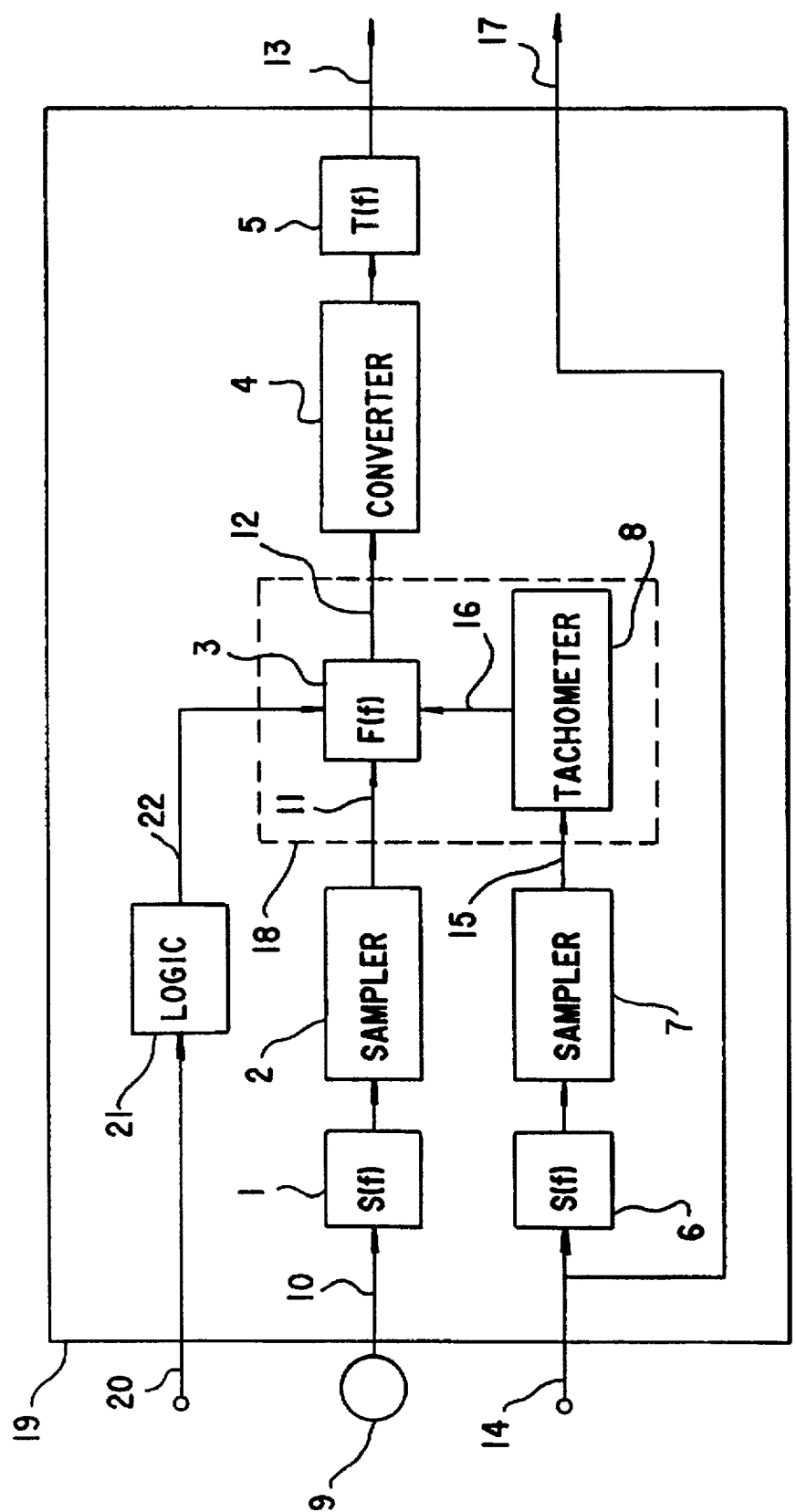

An example implementation of a system of the current invention is shown in FIG. 10. It consists of an electronic circuit 19, which may be a printed circuit board with discrete components or a single integrated circuit chip. A microphone 9 provides signal 10 containing speech and interference. This signal is passed through anti-aliasing filter 1 and sampler 2 to provide sampled data signal 11 as input to frequency periodic filter 3. The discrete output 12 from the frequency periodic filter 3 is passed to converter 4 and anti-imaging filter 5 to provide a continuous output signal 13. The output signal 13 may be supplied to a radio or other communication device. A second input signal 14 provides information as to the fundamental frequency of the interference. For application to a siren noise canceller this signal may be the siren drive signal or a signal from which the siren drive is generated or a signal derived from the signal 10 by bandpass filtering. For retro-fit applications the signal 14 may also be provided as an output signal 17. The second input signal 14 is supplied to anti-aliasing filter 6 and sampler 7 to provide sampled data signal 15. This signal is then supplied to the period measuring means 8 (tachometer) to provide a signal 16 related to the fundamental period of the disturbance. Signal 16 is then used to adjust the characteristic of the frequency periodic filter 3.

Additional input 20 may be provided to supply added information to the system. This signal is supplied to logic circuit 21 which produces control signal 22. One use of this additional signal is to provide a switch to bypass the frequency periodic filter so that the system has unity gain in the speech band (this is useful if the siren is not in use and for testing). Another use of the input is as a 'push to talk switch' which cuts off the output from the system except when speech is present in the input. Yet another use of the additional input is to indicate the type of siren signal being used. Many types of siren are in use with varying frequency change rates. Different frequency periodic filters may be appropriate for different siren noises, so the signal 22 may be used to switch between different filters.

Alternatively, the siren type can be identified from the input signals, by measuring the rate of change of the fundamental period, for example.

For digital applications the frequency periodic filter 3 and the tachometer 8 may be implemented on a Digital Signal Processor 18.

A delay may be inserted into signal 16 when the signal 14 is received in advance of the noise.

An automatic gain control circuit may be inserted between microphone signal 10 and the sampler 2. This allows for a sampler with a smaller dynamic range to be used, which reduces the cost of the control system.

When multiple fundamental frequencies are present in the noise, several frequency periodic filters may be cascaded in series. In this case a frequency signal and corresponding filter is used for each noise source.

There are many other applications for frequency periodic filters of this invention including the removal of noise from communication signals in vehicles, propeller driven aircraft, helicopters, Magnetic Resonance Imaging machines and the removal of 'hum' in signals.

We claim:

1. A method for designing a frequency periodic filter with a frequency response which is substantially periodic in some bandwidths, said filter including filter coefficients and effective delay elements, said method comprising, determining said filter coefficients by designing a first sampled data filter, said first filter including said filter coefficients and unity delay elements, such that the frequency response of said first filter corresponds to one period of the desired frequency response, setting said effective delay elements to have an effective delay proportional to the reciprocal of the period of said frequency response.

2. A method as in claim 1 in which each frequency periodic filter is a finite impulse response filter with one or more coefficients.

3. A method as in claim 1 in which each frequency periodic filter is an infinite impulse response filter with one or more coefficients.

4. A method as in claim 1 in which the first sampled data filter is a high-pass filter.

5. A method as in claim 1 in which the first sampled data filter is a low-pass filter.

6. A method as in claim 1 in which the first sampled data filter is a band-pass filter.

7. A method as in claim 1 in which the sampling frequency of said frequency periodic filter is an integer multiple of the period of said desired frequency response.

8. A method for substantially removing periodic noise or interference from an input signal, said method comprising:

passing said input signal through a first sampled data filter to produce a filtered input signal;

passing said filtered input signal through a frequency periodic filter, said filter containing weighing coefficients and second sampled data filters, to obtain an output signal;

adjusting a delay produced by each second sampled data filter according to the fundamental period of the periodic noise or interference; wherein each second sample data filter contains weighing coefficients and unit sample delay elements.

9. A method as in claim 8 in which said input signal is a communications signal obtained from a microphone, and said output signal is adapted to be provided to a communications system.

10. A method as in claim 8 including the steps of:

determining the period of said periodic noise or interference; and varying the coefficients of the second sampled data filter in relation to said period.

11. A method as in claim 10 in which said period is determined from said input signal.

12. A method as in claim 10 in which said period is determined from an additional input signal which is time related to the cause of said interference.

13. A method as in claim 12 in which two or more frequency periodic filters are arranged in series so as to remove the periodic noise from two or more sources.

14. A method as in claim 12 in which said input signal is a communications signal obtained from a microphone, said output signal is provided to a communications system.

15. A method as in claim 8 in which the coefficients of said first sampled data filter are set to predetermined values according to the rate of change of the frequencies of the interference.

16. A method as in claim 8 and including providing a signal to switch between different frequency periodic filters.

17. A system for removing periodic noise or interference from an input signal, said system comprising:

first input means for receiving said input signal;

second input means for receiving a reference signal from which the period of said periodic noise or interference can be determined;

a frequency periodic filter for filtering said input signal, said frequency periodic filter including fixed filter coefficients and variable effective delays, each effective delay being associated with one or more of the filter coefficients;

output means to provide an output signal corresponding to said input signal minus the periodic noise or interference, characterized in that the effective delays in said frequency periodic filter are adjusted to be proportional to the reciprocal of the period of said periodic noise or interference.

18. A system as in claim 17 wherein said frequency periodic filter includes a tachometer means.

19. A system as in claim 17 wherein said system includes an automatic gain control on the input means which allows for a sampler with a smaller dynamic range to be used.

20. A system as in claim 17 including a microphone means which provides said input signal to said first input means.

21. A system as in claim 17 and including a communication system to which said output signal is provided.

22. A system as in claim 21, wherein said microphone means provides said input signal to said first input means and said output signal is provided to said communication system.

* * * * *